(12) United States Patent
Knowles et al.

(10) Patent No.: US 7,132,161 B2
(45) Date of Patent: *Nov. 7, 2006

(54) FIBER ADHESIVE MATERIAL

(75) Inventors: Timothy R. Knowles, Del Mar, CA (US); Christopher L. Seaman, San Diego, CA (US)

(73) Assignee: Energy Science Laboratories, Inc., San Diego, CA (US)

( * ) Notice: Subject to any disclaimer, the term of this patent is extended or adjusted under 35 U.S.C. 154(b) by 107 days.

This patent is subject to a terminal disclaimer.

(21) Appl. No.: 10/464,830

(22) Filed: Jun. 17, 2003

(65) Prior Publication Data

US 2004/0071870 A1 Apr. 15, 2004

Related U.S. Application Data

(63) Continuation-in-part of application No. 09/593,587, filed on Jun. 13, 2000.

(60) Provisional application No. 60/390,239, filed on Jun. 17, 2002, provisional application No. 60/139,443, filed on Jun. 14, 1999.

(51) Int. Cl.
*B82B 1/00* (2006.01)
*B82B 3/00* (2006.01)

(52) U.S. Cl. ...................... 428/364; 428/903; 428/401; 428/376; 428/379; 977/DIG. 1; 442/330; 442/334; 442/340; 165/185

(58) Field of Classification Search ............ 385/78–80; 428/903, 92, 97, 114, 368; 427/200, 206; 156/72, 279
See application file for complete search history.

(56) References Cited

U.S. PATENT DOCUMENTS

| | | | |
|---|---|---|---|
| 2,542,637 A | 2/1951 | De Poy et al. | 148/15 |
| 3,294,880 A | 12/1966 | Turkat | 264/29 |
| 3,375,308 A | 3/1968 | Turkat | 264/29 |

(Continued)

FOREIGN PATENT DOCUMENTS

JP 2-154991 6/1990

(Continued)

OTHER PUBLICATIONS

Chen et al., Chemical Physics Letters, Jun. 27, 1997, Elsevier, 178-182.*

(Continued)

*Primary Examiner*—Elizabeth M. Cole
*Assistant Examiner*—Matthew Matzek
(74) *Attorney, Agent, or Firm*—Knobbe Martens Olson & Bear LLP

(57) ABSTRACT

A fiber velvet comprising nano-size fibers or nanofibrils attached to micro-size fibers is disclosed. Methods of manufacturing the velvet as well as various uses of the velvet are also described. For example, the fiber velvet can be used as a thermal interface or as an adhesive material. The nanofibrils may be attached to a flat base or membrane, or may be attached to the tip portions of the micro-size or larger diameter fibers. Various attributes of the micro-size fibers and of the nano-size fibers, for example, geometry (e.g. size, length, packing density) material type (e.g. carbon, metal, polymer, or ceramic) and properties (e.g. conductivity, modulus, surface energy, dielectric constant, surface roughness) can be selected depending on the desired attributes of the fiber velvet. The nanofibrils have a diameter of less than about 1 micron, and may advantageously be formed from single walled and/or multi-walled carbon nanotubes.

21 Claims, 9 Drawing Sheets

U.S. PATENT DOCUMENTS

| | | | |
|---|---|---|---|
| 3,531,249 A | 9/1970 | Turkat | 23/209.2 |
| 3,543,842 A | 12/1970 | Merges | 165/82 |
| 3,609,992 A | 10/1971 | Cacheux | 62/514 |
| 3,969,754 A | 7/1976 | Huniya et al. | 357/65 |
| 4,161,747 A | 7/1979 | Jennings | 357/82 |
| 4,318,954 A | 3/1982 | Jensen | 428/209 |
| 4,414,142 A | 11/1983 | Vogel et al. | 252/506 |
| 4,415,025 A | 11/1983 | Horvath | 165/185 |
| 4,424,145 A | 1/1984 | Sara | 252/509 |
| 4,435,375 A | 3/1984 | Tamura et al. | 423/439 |
| 4,470,063 A | 9/1984 | Arakawa et al. | 357/67 |
| 4,482,912 A | 11/1984 | Chiba et al. | 357/67 |
| 4,485,429 A | 11/1984 | Mittal | 361/386 |
| 4,591,659 A | 5/1986 | Leibowitz | 174/68.5 |
| 4,630,174 A | 12/1986 | Kaufman | 361/388 |
| 4,749,514 A | 6/1988 | Murakami et al. | 252/500 |
| 4,816,289 A | 3/1989 | Komatsu et al. | 423/447.3 |
| 4,849,858 A | 7/1989 | Grapes et al. | 361/388 |
| 4,867,235 A | 9/1989 | Grapes et al. | 165/185 |
| 4,878,152 A | 10/1989 | Sauzade et al. | 361/386 |
| 4,933,804 A | 6/1990 | Bertenshaw et al. | 361/111 |
| 4,966,226 A | 10/1990 | Hartman | 165/104.26 |
| 4,985,805 A | 1/1991 | Riedel et al. | 361/386 |
| 5,014,161 A | 5/1991 | Lee et al. | 361/388 |
| 5,077,637 A | 12/1991 | Martorana et al. | 361/386 |
| 5,111,359 A | 5/1992 | Montesano | 361/388 |
| 5,150,748 A | 9/1992 | Blackmon et al. | 165/41 |
| 5,212,625 A | 5/1993 | Van Andel et al. | 361/383 |
| 5,224,030 A | 6/1993 | Banks et al. | 361/386 |
| 5,260,124 A | 11/1993 | Gaier | 428/257 |
| 5,287,248 A | 2/1994 | Montesano | 361/708 |
| 5,316,080 A | 5/1994 | Banks et al. | 165/185 |
| 5,323,294 A | 6/1994 | Layton et al. | 361/699 |
| 5,389,400 A | 2/1995 | Ting et al. | 427/249 |
| 5,402,004 A | 3/1995 | Ozmat | 357/717 |
| 5,424,054 A | 6/1995 | Bethune et al. | |
| 5,424,916 A | 6/1995 | Martin | 361/698 |
| 5,482,601 A | 1/1996 | Ohshima et al. | 204/173 |
| 5,494,753 A | 2/1996 | Anthony | 428/408 |
| 5,520,976 A | 5/1996 | Giannetti et al. | 428/36.3 |
| 5,523,260 A | 6/1996 | Missele | 437/209 |
| 5,542,471 A | 8/1996 | Dickinson | 165/170 |
| 5,566,752 A | 10/1996 | Arnold et al. | 165/185 |
| 5,591,312 A | 1/1997 | Smalley | 204/157.41 |
| 5,604,037 A | 2/1997 | Ting et al. | 428/408 |
| 5,608,267 A | 3/1997 | Mahulikar et al. | 257/796 |
| 5,698,175 A | 12/1997 | Hiura et al. | |
| 5,753,088 A | 5/1998 | Olk | 204/173 |
| 5,805,424 A | 9/1998 | Purington | |
| 5,814,290 A | 9/1998 | Niu et al. | 423/344 |
| 5,830,326 A | 11/1998 | Ijima | 204/173 |
| 5,849,130 A | 12/1998 | Browne | |
| 6,054,198 A | 4/2000 | Bunyan et al. | |
| 6,063,243 A | 5/2000 | Zettl et al. | 204/164 |
| 6,143,445 A | 11/2000 | Ferment | |
| 6,156,256 A | 12/2000 | Kennel | |
| 6,177,213 B1* | 1/2001 | Fetcenko et al. | 429/218.1 |
| 6,183,854 B1 | 2/2001 | Stiller et al. | |
| 6,303,094 B1* | 10/2001 | Kusunoki et al. | 423/447.1 |
| 6,361,861 B1 | 3/2002 | Gao et al. | |
| 6,436,506 B1 | 8/2002 | Pinter et al. | |
| 6,737,160 B1* | 5/2004 | Full et al. | 428/397 |
| 6,872,439 B1* | 3/2005 | Fearing et al. | 428/99 |
| 6,913,075 B1* | 7/2005 | Knowles et al. | 165/185 |
| 2003/0124312 A1 | 7/2003 | Autumn | |
| 2003/0203139 A1* | 10/2003 | Ren et al. | 428/34.3 |
| 2003/0208888 A1 | 11/2003 | Fearing et al. | |

FOREIGN PATENT DOCUMENTS

WO     WO 01/49776     7/2001

OTHER PUBLICATIONS

Chung, D.D.L., Carbon Fiber Composites, 1994, Elsevier, 3-11.*

Slitti et al., Nanomolding based Fabrication of Synthetic Gecko Foot-Hairs, IEEE Nanotechnology Conference, pp. 37-40, Washington D.C. (Aug. 2002).

Autumn, et al., Low cost of locomotion in the banded gecko: a test of the nocturnality hypothesis, Physiological Zoology, 70:660-669 (1997).

Autumn, et al., Adhesive force of a single gecko foot-hair. Nature 405:681-685 (2000).

Autumn, et al., Evidence for Van der Waals Adhesion in Gecko Setae, Proc. Nat. Acad. Sciences, vol. 99, pp. 12252-12256 (Sep. 17, 2002).

Autumn, et al., Dynamics of geckos running vertically. Amer. Zool. 38(5): 84A (1999).

Autumn, et al., Function of feet in ascending and descending geckos. Amer. Zool. 38(5): 84,A (1999).

Ren, et al., Synthesis of Large Arrays of Well-Aligned Carbon Nanotubes on Glass, SCIENCE, vol. 282, pp. 105-107, Nov. 6, 1988.

Huang, et al., Growth of Highly Oriented Carbon Nanotubes of Plasma-Enhanced Hot Filament Chemical Vapor Deposition, Applied Physics Letters, vol. 73, No. 6, pp. 3845-3847, Dec. 28, 1998.

Li, et al., Highly-ordered Carbon Nanotube Arrays for Electronics Applications, Applied Physics Letters, vol. 75, No. 3, pp. 367-369, Jul. 19, 1999.

Geim, et al., Microfabricated adhesive mimicking gecko foot-hair, Nature Materials, vol. 2, pp. 461-461, Jul. 1, 2003.

* cited by examiner

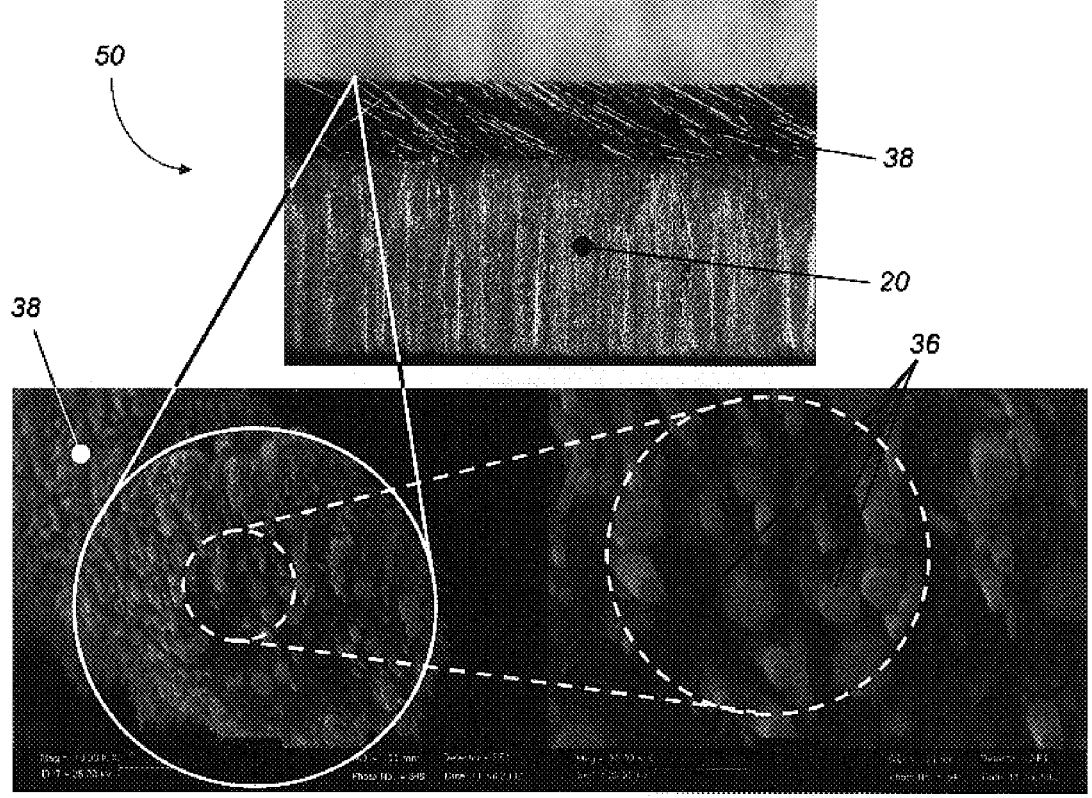

FIBER ADHESIVE MATERIAL

CROSS REFERENCE TO RELATED APPLICATIONS

This application claims priority to U.S. Provisional Patent Application Ser. No. 60/390,239, titled Dendritic Adhesive, and filed on Jun. 17, 2002 and is a continuation-in-part of U.S. patent application Ser. No. 09/593,587, titled Thermal Interface, and filed on Jun. 13, 2000, which claims priority to U.S. Provisional Patent Application Ser. No. 60/139,443, entitled Thermal Interface, and filed on Jun. 14, 1999. The entire disclosures of all of these applications are hereby incorporated by reference in their entirety.

BACKGROUND OF THE INVENTION

1. Field of the Invention

The invention relates to adhesive materials such as tapes that provide a dry and reusable medium for adhering two surfaces together.

2. Description of Related Art

Much of thermal management involves the transfer of heat from one element to another. While individual elements might have very high conductance, the heat transfer rate between contact surfaces of the two elements can limit overall performance of the thermal control system. Similarly, the strength of an adhesive bond formed between the two elements is often dependent on the contacting surfaces. The heat transfer rate and adhesive strength between the two elements can improve by maximizing the contact region between the two elements.

Existing methods of bonding include brazing, soldering, gluing, bolting, taping, sewing, zippering, and use of Velcro® fasteners. Desirable properties include high strength of attachment, easy removability, reliability, and reusability. Other considerations include chemical compatibility, outgassing, and mass. Brazing and gluing with adhesive is strong, but not reusable nor easily removable. Bolts can be heavy and require special fixturing for attaching. Tape is not very strong, tends to leave a residue, and loses its sticking ability with use. It does not work well in wet environments.

A different form of adhesive is found in a foot of a Tokay gecko. The foot includes a structure which allows the gecko to run over glass ceilings or climb wet glass walls. The toes of the Tokay gecko have pads consisting of thousands of 5 um-diameter keratinous fibers (called setae). The ends of the setae split into hundreds of 100-nm diameter fibrils. Each nanofibril terminates in an ellipsoidal structure called a "spatula." Each spatula has a diameter ranging from 200–500 nm. The adhesive force of a single seta against Si was measured to be 200 µN (20 mg). It has been hypothesized that van der Waal forces are responsible for the gecko's amazing ability to climb up smooth vertical surfaces. If utilized to full capacity, the 100 $mm^2$ area of a gecko's foot, consisting of 500,000 such setae, should then be able to produce 100 N (10 kg) of adhesive force. The corresponding effective adhesive strength is 106 MPa (15,000 psi). This adhesive strength is well suited for many applications. The micron-size setae serve as a compliant support which conforms to the surface to allow the nanometer-sized tips (themselves compliant on a small scale) to make intimate contact with the surface.

A manufactured adhesive that could provide the adhesion properties of the gecko foot is desirable. Such an adhesive would be compliant and could stick by intermolecular (van der Waals) forces resulting from its intimate contact with the surface. Such an adhesive would provide broad utility as an adhesive or attachment mechanism. The adhesive could be strong, dry, removable, reusable, and lightweight, combining many of the most desirable properties of the gecko foot. Such an adhesive may also have enhanced thermal and/or electrical conductance, providing an effective thermal/electrical interface with a built-in attach mechanism that is strong, removable, and reusable.

SUMMARY OF THE INVENTION

The systems and methods of the present invention have several features, no single one of which is solely responsible for its desirable attributes. Without limiting the scope of this invention as expressed by the claims which follow, its more prominent features will now be discussed briefly. After considering this discussion, and particularly after reading the section entitled "Detailed Description" one will understand how the features of this invention provide several advantages over traditional paper coupon systems.

One aspect of the invention is an adhesive material that comprises a base, an array of first fibers bonded to the base, each having a cross sectional diameter of less than approximately 15 microns, and an array of second fibers bonded predominantly to a portion of at least some of the first fibers and having a cross sectional diameters of less than about 1 micron, the second fibers being arranged and configured to form a strong VdW bond when pressed against a mating surface.

Another aspect of the present invention is a method for making an adhesive material. The method comprises growing aligned whiskers having a diameter of less than about 1 micron from the tips of carbon fibers having a diameter of greater than about 3 microns and less than about 15 microns, and optionally depositing a material on a portion of the whiskers to form non-planar tips.

Another aspect of the present invention is an adhesive material tape that comprises a first plurality of fibers having first and second ends, the first plurality of fibers being predominantly aligned such that the first ends are bonded to a base surface of the tape, and a second plurality of fibers having first and second ends, the second plurality of fibers being predominantly aligned such that the first ends are bonded to the second ends of the first plurality of fibers and the second ends of the second plurality of fibers being arranged to adhere to a mating surface by intermolecular attraction.

Yet another aspect of the present invention is a method for enhancing the performance of an adhesive tape made from a plurality of predominantly aligned carbon fibers having diameters of less than approximately 15 microns. The method comprises placing a plurality of nanofibrils having diameters of approximately 1 micron proximate to at least some tips of the predominantly aligned carbon fibers, and depositing a film on an end portion of the nanofibrils.

Still another aspect of the present invention is an adhesive tape that comprises a central support, and a plurality of nanofibrils extending from one or both major surface(s) of the central support, wherein at least some of the nanofibrils have a diameter of less than about 1 micron, the nanofibrils being arranged and configured to form a strong vdW bond when pressed against a mating surface.

BRIEF DESCRIPTION OF THE DRAWINGS

FIG. 7A is a side view of a single-sided fiber velvet that comprises an array of fibers canted at an angle.

FIG. 7B is a detailed view of one of the fibers from FIG. 7A showing nanofibrils attached to the tip of a single fiber.

FIG. 7C is a detailed view of the nanofibrils from FIG. 7B.

DETAILED DESCRIPTION

Figure 1A:
FIG. 1A is a side view of one embodiment of a thermally conductive gasket incorporating nanofibrils.

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

The inventions described herein relate to materials and associated devices that transfer heat between and/or adhere one device/surface and another. For example, a compliant thermal interface material developed by the applicant, which is presently marketed as VEL-THERM, is superior to existing commercial thermal interface gaskets. This material is a soft, carbon fiber velvet consisting of numerous high-κ (as high as 1000 W/mK) carbon fibers aligned perpendicularly to the interface plane. In some embodiments, such a "brush" of predominantly aligned carbon fibers is embedded in an adhesive substrate such that the tips of the fibers are attached to the surface of the substrate at one end, and are exposed at the other end. Free-standing "interleaf" gaskets can also be fabricated. These have fiber tips on both major surfaces, and the fibers are held together with an encapsulant such as a silicone or epoxy material.

Commercially available carbon fibers are formed from either pitch or PAN precursor material and drawn onto fiber tow. Each fiber typically has diameter ~10 μm, but which may vary between approximately 3 and 15 microns. Pitch fibers are graphitized by heating to high temperatures (near 3000° C.), giving them high thermal conductivities κ ~1000 W/mK.

When placed between two surfaces, each fiber provides a high thermal conductivity path from one surface to the other. For uneven gaps, each fiber can bend independently in order to span the local gap. Low pressures are necessary to allow each fiber to touch both surfaces. Contact is maintained-by either clamping or pressing the fiber tips into adhesive and bonding in place. By using high-κ fibers oriented in the direction of heat flow, such gaskets have a high κ (as high as 200 W/mK), while at the same time being even more compliant than conventional, particle-filled gaskets. Such velvet gaskets also work better than copper foil (at comparable pressures) because they provide a greater area of contact, conforming to uneven surfaces.

Many configurations are possible depending on the application requirements. Thus, the velvet can be bonded to one or both surfaces with various adhesives or PSA "tapes" including metal foils. The highest measured total thermal conductance has been achieved by a high-κ carbon fiber interleaf "gasket" in which the fibers are encapsulated in a silicone gel encapsulant.

The total thermal resistance of a thermal gasket interface is the sum of three contributions: the resistance of the bulk material itself, and the resistances of each interface where the material comes in contact with the interfacing surface. In terms of conductance (inverse of resistance) this may be written as:

$$h_{total}^{-1} = h_{bulk}^{-1} + h_{interface1}^{-1} + h_{interface2}^{-1}$$

In some embodiments, $h_{bulk} = \kappa_{bulk}/t = 400,000$ W/m²K, which is 40 × higher than $h_{total}$. Thus, the total joint resistance is dominated by the contact resistance between the fiber tips and the contacting surfaces. Each interface has $h_{interface}$ ~20,000 W/m²K. If the contact conductance is increased to values comparable to the bulk conductance, the total conductance of the interface can be dramatically improved.

To improve this contact conductance, some embodiments of the invention utilize very small diameter fibers having diameters less than about 1 micron either in conjunction with, or as an alternative to, the typically 3–15 micron diameter conventional carbon fibers. These small diameter fibers are referred to herein as nanofibrils or whiskers. Conventional carbon and silica whiskers may be utilized. Conventional carbon whiskers may be grown from a Ni or Fe catalyst by CVD processing. However, they have typically relatively large diameters of ~1 μm. Furthermore, in order for conventional carbon whiskers to have high κ, they must be graphitized by heating to ~3000° C.

In some advantageous embodiments of the invention, the whiskers comprise single or multi-walled carbon "nanotubes". A nanotube is a recently discovered form of carbon that is basically an elongated version of a $C_{60}$ molecule, also known as a Buckminster Fullerene, and commonly referred to as a "Buckyball". A single-walled nanotube consists of a rolled graphene sheet, forming a tube of diameter 1.4 nm, and capped at each end. Nanotubes display many interesting and useful properties including very high thermal conductivity and high stiffness. They are highly robust; they elastically buckle, rather than fracture or plastically deform, when bent to large angles. Multiwalled nanotubes, which have larger diameters of up to about 500 nanometers, can also be grown, with similar properties. These properties make both single and multi-walled nanotubes surprisingly useful as components of thermal interfaces. Their thermal conductivity provides excellent heat transfer characteristics, and their mechanical properties provide the capacity to form large areas of compliant contact with adjacent surfaces.

Figure 1B:
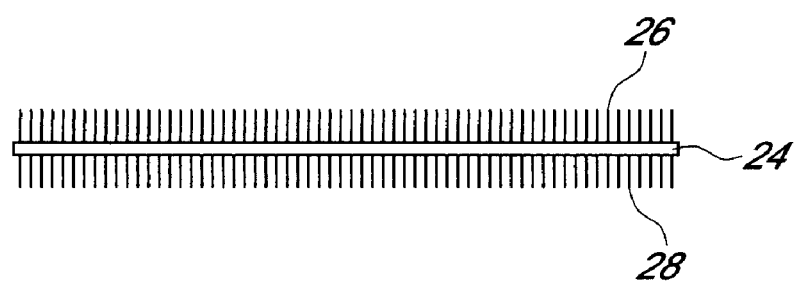
FIG. 1B is a side view of another embodiment of a thermally conductive gasket incorporating nanofibrils.

One embodiment of a thermal interface constructed in accordance with these principles is illustrated in FIGS. 1A and 1B. Referring now to FIG. 1A, the thermal interface comprises a base 20 which has extending therefrom an array of nanofibrils 22 having diameters of less than about 1 micron. FIG. 1B illustrates a two sided nanofibril gasket. In this embodiment, the base 24 forms a central support, nanofibrils 26, 28 extend in opposite directions from both major surfaces. The central support 24 or base 20 may, for example, be about 1 to 20 or mils thick, depending on the desired mechanical properties.

Several methods of growing arrays of nanofibrils/whiskers on substrate surfaces are known in the art. Chemical vapor deposition techniques have been used to grow relatively aligned nanotubes on nickel and nickel coated glass substrates as reported in Ren, et al., *Science*, Volume 282, pages 1105–1107 (Nov. 6, 1998) and in Huang et al., *Applied Physics Letters*, Volume 73, Number 26, pages 3845–3847 (Dec. 28, 1998), the disclosures of which are hereby incorporated by reference in their entireties. Ren et al. used a plasma-enhanced chemical vapor deposition (PECVD) process in which the nanotubes grew from a nickel film catalyst in the presence of acetylene ($C_2H_2$), ammonia (NH3), and nitrogen ($N_2$) at temperatures less than 666° C. Multiwalled nanotubes with diameters from 20–400 nm and lengths from 0.1–50 µm were obtained. Thicker Ni films resulted in larger diameter nanotubes. Transmission electron microscopy (TEM) images showed that the nanotubes were multiwalled, centrally hollow tubes, not solid fiber. Each wall is presumed to be a highly thermally conductive graphitic layer. Key to their success seems to be the introduction of ammonia, which Ren et al. conjectured participated with the nickel in the catalytic reaction. The plasma enables growth at lower temperatures. The electric field of the plasma may also play a role in forming the nanotube array.

In one advantageous embodiment, the base 20 or membrane 24 is aluminum, and the arrays of nanofibrils are created by forming a film of porous alumina on the aluminum substrate, growing nanotubes within the pores of the alumina film, and then etching away the alumina. This method is described in detail in J. Li et al., *Applied Physics Letters*, Volume 75, Number 3 (Jul. 19, 1999), the disclosure of which is hereby incorporated by reference in its entirety. With this method, a hexagonally ordered array of substantially axially aligned carbon multi-walled nanotubes on aluminum is fabricated using a hexagonal "nanochannel alumina" (NCA) membrane as a template. The template is formed on pure aluminum by anodization and consists of alumina with long, cylindrical pores with diameters from 10–500 nm diameter and lengths that span the thickness of the "membrane". Cobalt catalyst "nanoseeds" are deposited in the bottom of each pore by electrodeposition. Multiwalled nanotubes are then grown in each of the pores by hot-wall CVD at 650° C. (just below the melting point of Al). The alumina is then etched away, leaving an array of multiwalled nanotubes on an aluminum substrate. Double sided thermal gaskets as shown in FIG. 1B may be created by forming the alumina template on both sides of an aluminum sheet, and growing nanotubes on both sides. Alternatively, a thick porous alumina membrane may comprise the support.

Outstanding features of this array are (1) uniformity of nanotube diameters, (2) near perfect alignment perpendicular to the substrate, (3) regularly spaced nanotubes in a highly ordered hexagonal lattice, (4) uniformity of nanotube lengths. Furthermore, this technique allows independent control of the nanotube diameter, length, and packing fraction. The fabrication technique has advantages over others. It eliminates the need to use a plasma, hot filament, and photolithography, involving only wet chemistry and hot-wall CVD. It can be scaled up for large areas. Furthermore, the parameters are in the proper range for application as a thermal interface, with the nanotubes being about 10–500 nanometers is diameter, a 50% packing fraction, and lengths from 1–100 microns.

In another embodiment, nanofibrils (or whiskers) are placed in contact with one or both ends of at least some of the fibers of an array of predominantly aligned larger diameter carbon fibers. In this embodiment, rather than enhancing the thermal interface performance of a foil by adding nanofibrils to one or both surfaces of a foil membrane, the performance of a carbon fiber brush/velvet which is formed from a predominantly aligned array of 3–15 micron diameter fibers is enhanced by the addition of nanofibrils to the tip region of the larger diameter fibers.

An analysis of heat transfer in the tip region of a carbon fiber gasket illustrates the importance of this region to the overall heat transfer efficiency. For small temperature differences, radiation exchange can be neglected. When the contact area is small compared to the contacting bodies, there is an extra "constriction resistance" due to bottlenecking of the heat flow through the constriction, given by:

$$R_{constriction} \sim 1/(4\kappa a)$$

where $\kappa$ is the harmonic mean of the contacting materials: $\kappa^{-1} = \kappa_1^{-1} + \kappa_2^{-1}$, and a is the diameter of the contact area (taken to be circular). For small a, which depends on applied pressure, material hardness, tip geometry, and surface roughness, this resistance can be quite large. A conducting whisker array on the fiber tip removes the heat flow bottleneck, greatly alleviating the constriction resistance.

Attaching whiskers to the fiber tips improves thermal conductance of the gasket for several reasons. In applications where the interface is in a vacuum, the whiskers at the fiber tip will reduce the constriction resistance of the fiber contact point. In a vacuum, heat is conducted through the physical contact area between the fiber tips and the contacting surface, which is often only a small fraction of the fiber cross sectional area. The contact pressure P is low compared to the hardness H of the contacting materials (P $<<10^{-4}$ H), which therefore do not deform very much. In addition, the fiber tip is not flat, being highly irregular in shape.

In the presence of air or other fluid surrounding medium, and at low contact pressures (P $<10^{-4}$H), heat is mostly conducted through the fluid-filled gap; that is, the solid spot conduction is small compared to conduction through the fluid. Furthermore, convective heat transfer in air is usually negligible for gap widths less than ~6 mm. For an irregularly-shaped fiber tip, the average gap δ between the bottom of the fiber and the contacting surface is of the order of the fiber radius (5 microns). Assuming conditions are such that the mean free path is small (~0.3 microns for air at STP) compared to δ, we may use Fourier's law of heat conduction. The conductance through the bottom of the fiber is then $q/\Delta T = \kappa \delta$.

The thermal conductance through a medium of conductivity κ between an isothermal flat surface and an isothermal vertical cylinder of length L and diameter D may be approximated as:

$$q/\Delta T = \kappa \frac{2\pi L}{\ln(4L/D)}, \text{ if } D/L \ll 1.$$

We take the effective length to be about the average interfiber distance $L \sim D\phi^{-1/2}$, where φ is the fiber packing fraction. The total thermal conductance per unit area of one of the interfaces of a velvet is then approximated as:

$$h_{interface} = \frac{2\kappa\phi}{D}\left(1 + \frac{4L/D}{\ln(4L/D)}\right) \sim \frac{2\kappa\phi}{D}\left(1 + \frac{4\phi^{-1/2}}{\ln(4\phi^{-1/2})}\right)$$

The second term dominates; that is, most of the heat conducts from the sides of the fiber near the tip through the conducting medium to the flat surface. For φ=20%, $h_{interface} \sim 12\phi\kappa/D \sim 6000$ W/m²K for air (κ=0.025 W/mK) and ~24,000 W/m²K for silicone encapsulant (κ=0.1 W/mK).

Thus, a fiber tip enhanced with a nanofibril or whisker array would fill the gap with a medium with a higher effective κ, thereby improving $h_{interface}$. This may be accomplished in a variety of ways. In one embodiment, an unaligned discontinuous powder of nanofibrils is used to coat the tip region of the large fiber velvet. These powders are commercially available as, for example, type Pyrograf III whiskers from Applied Sciences, Inc. This material is a powder of cut whiskers with diameters of about 50–300 nanometers and lengths of about 20 to 80 microns. The nanofibril powder may be used as filler for thermally conductive grease, for example, which is applied to the tips of the velvet fibers. Alternatively, the powder is placed directly on the tips by soaking them in a solution of Pyrograf III in ethanol. The solution is advantageously ultrasonically vibrated to better disperse and disentagle the whiskers. After application, the presence of the nanofibrils in the tip region of the larger fibers improves heat transfer at the interface between the larger fiber tips and the surface of the component the tips are in contact with.

Figure 2:
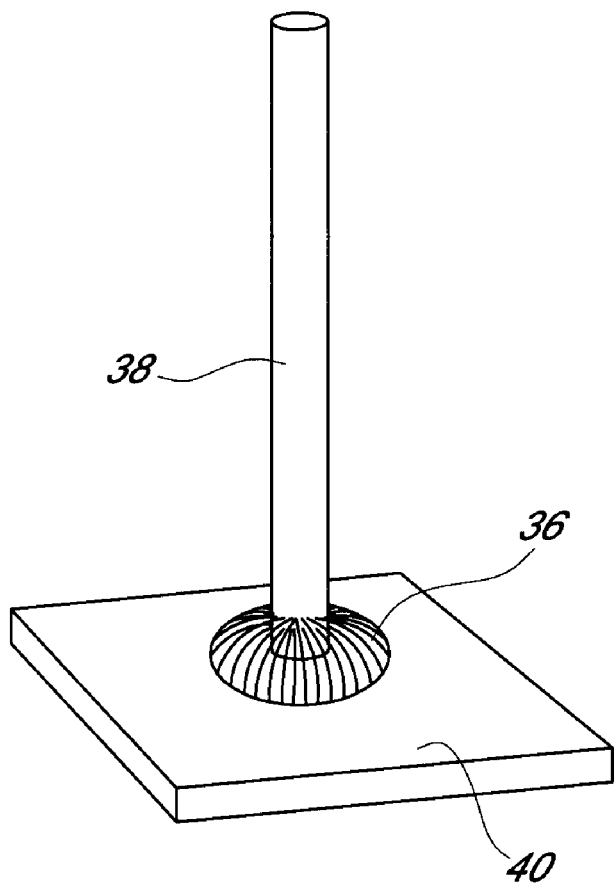
FIG. 2 is a perspective view of a carbon fiber having a nanofibrils attached to the tip.

Because the nanofibril powder is not an aligned array of nanofibrils, there are many inter fibril interfaces which still interfere with efficient heat transfer. Thermal conductance will be improved further if the nanofibrils formed a more ordered array with the nanofibrils spanning the gap between the tip of the larger diameter fiber and the component surface from end to end. This is shown conceptually in FIG. 2. As shown in this Figure, a mop of nanofibrils 36 is attached to the tip portion of a larger diameter fiber 38. The nanofibrils 36 preferably extend predominantly away from the larger diameter fiber 38 and toward the component surface 40. In this embodiment, the nanofibrils may be configured to span the gap between each fiber and the mating surface, forming a high conductivity (κ~200 W/mK), soft mop that effectively thermally shorts out the resistive gap. Although heat transfer efficiency between the tip of the larger fiber 38 and the component surface 40, may be expected to be better with better nanofibril alignment, even relatively poorly aligned masses of nanofibrils may be used to improve fiber tip heat transfer performance.

In one set of gasket fabrication procedures performed by the inventors, nanofibrils were formed onto larger diameter fibers and fiber velvets. In these procedures a CVD apparatus comprising a stainless steel (SS) vacuum chamber was utilized. In this chamber, a controlled gas mixture of ammonia and hydrocarbon (propylene or acetylene) flows down through a SS tube from the top, fills the chamber, and is pumped from the bottom with a mechanical pump. The gas flow is controlled and monitored with MKS mass flow controllers. The pressure is controlled by a needle valve above the pump and monitored with a MKS Baratron gauge. A quartz window allows visual monitoring of the experiment.

The plasma is sustained between two 2"-diameter, graphite electrodes. The bottom electrode is mounted on a ceramic (mullite) tube. A SS-sheathed thermocouple runs up the inside of the tube in order to monitor the temperature of the bottom electrode. The top electrode is mounted to the SS gas inlet tube; its height can be adjusted to control the gap. The bottom electrode (anode) is grounded through the thermocouple sheath. The top electrode (cathode) is electrically isolated from the chamber and carries the (negative) high voltage, powered by a 1 kW DC power supply capable of 1000V/1A.

A hot filament is used for three purposes: (1) thermal nonequilibrium heating of the sample (2) emission of electrons to stabilize the glow discharge and prevent arcing (3) cracking of the hydrocarbon gas. Tungsten wire, 15 mil diameter, is wound into a coil and mounted between the electrodes. The support and electrical connections are made through an electrical feedthrough in the back. The filament is powered through an isolation transformer at 60 Hz. In the later CVD runs, the W coil was prevented from "drooping" when heated by supporting the coil with an alumina tube running through it, thus allowing better control of its position. Typical power applied through the coil was 200 W.

In a typical procedure, the sample, including substrate and catalyst coating, is placed on the bottom electrode. The chamber is sealed and leak tested with a He leak detector with a mass spectrometer. A gas flow of 160 sccm ammonia is established with a pressure of a few torr. An ammonia plasma is initiated between the electrodes and the tungsten filament is heated to ~1500° C., as monitored by an optical pyrometer. The filament radiatively heats the sample. The temperature of the anode is monitored, although the sample is hotter than this. The sample is heated and etched for 10–15 mins. Then 80 sccm of hydrocarbon gas (propylene or acetylene) is introduced to start the CVD deposition, i.e. growth of carbon nanofibrils. After ~5 mins, the deposition is ceased and the chamber allowed to cool, after which the sample is removed and examined.

Figure 3A:
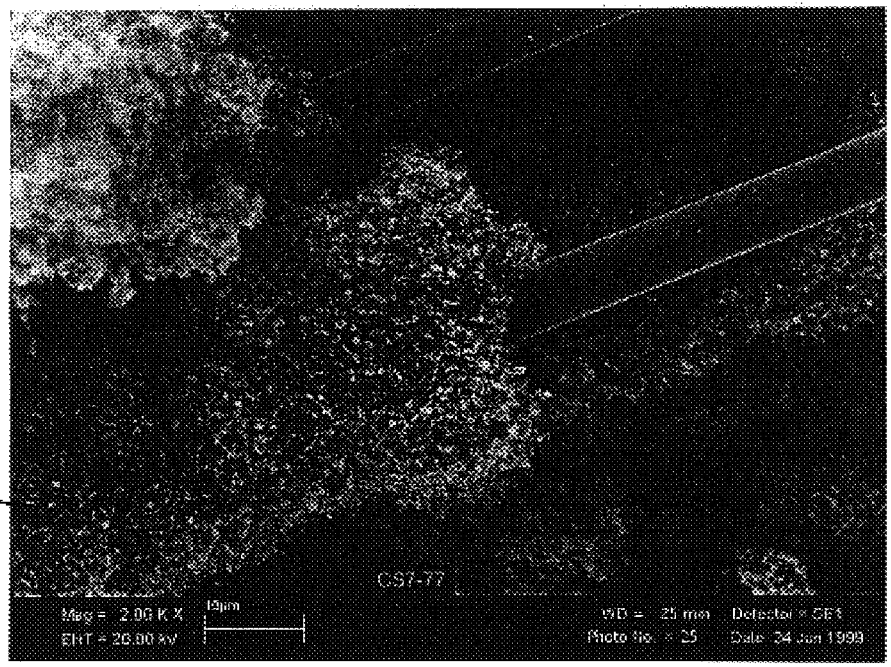
FIG. 3A is a scanning electron microscope image of a 7 micron diameter fiber with a mop of nanofibrils attached to the tip.
Figure 3B:
FIG. 3B is an increased magnification of the fiber of FIG. 3A.

Dozens of PE-HF CVD runs have been performed using the techniques described by Ren et al. and Huang et al. set forth above using a number of substrates including commercially available nickel coated carbon fibers, as well as nickel coated pitch and PAN carbon fiber velvet gaskets. FIGS. 3A and 3B illustrate nanofibril "mops" 40 grown onto nickel coated 7 micron diameter carbon fibers. These nanofibrils appear to be similar in structure to commercial vapor grown carbon fibers comprising tubes of concentric, graphitic layers. However, they tend to have a high defect density, exemplified by their not being straight, and causing them to have a lower thermal conductivity than ideal. The κ of these nanofibrils has not been measured, but they are most likely graphitizable, and if necessary, heat treatment at 2800° C. would likely give them a κ of ~2000 W/mK.

Figure 4:
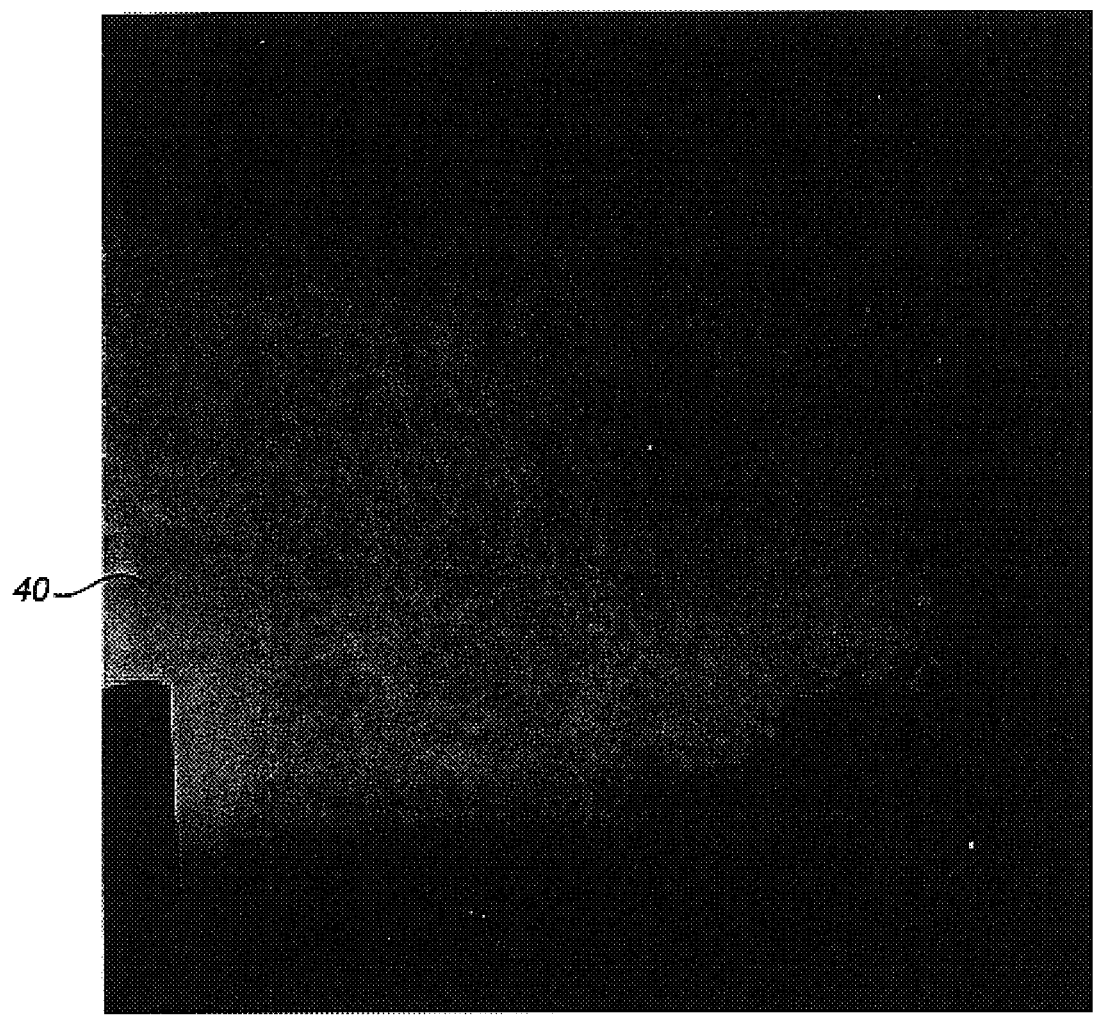
FIG. 4 is a scanning electron microscope image of a mop of nanofibrils which has been mechanically compressed.

Under an optical microscope, one of the "befuzzed" fibers was singled out for investigating how the nanotube mop responds to pressure exerted by a surface with which it comes into contact. The befuzzed fiber tip was contacted with flat-bladed tweezers with enough force to bend the fiber, as observed under the optical microscope. The sample was then placed in the SEM to examine the effect. Shown in FIG. 4 is an SEM image of the pressed befuzzed fiber tip. Although the diameter of the fiber is only 7 μm, the diameter of the befuzzed fiber is approximately 40 μm. Although a bit flattened, the mop can still be seen around the fiber tip, indicating some degree of mechanical resilience.

In another set of fabrication procedures, high thermal conductivity gaskets were made out of high-κ (~1000 W/mK), pitch carbon fibers (~10 micron diameter), The fibers are preferentially aligned in the z-direction such that each fiber spans the entire thickness of 1 mm. The fibers are held together with a light, epoxy wash coat. Capillary forces cause the epoxy to collect at the nodes where fibers contact each other. The packing fraction of fibers is about 10%, which implies a theoretical bulk thermal conductivity value of κ~100 W/mK and a bulk conductance of h~100,000 $W/m^2K$.

Gaskets of a high-κ velvet (100 W/mK) attached to a POCO carbon substrate may be made by electroflocking high-κ (generally about 100–1000 W/mK) pitch fibers (for example, 10 micron diameter×0.5 mm length) into high-κ (~2 W/mK) carbonizable polymer such as polyimide. Electroflocking is a known technique for forming aligned fiber arrays. Pneumatic or mechanical flocking techniques may also be used. A variety of carbon fiber types may also be utilized, such as are commercially available from Amoco Corp. or Toray. A nickel film is ion beam sputtered into the velvet, most notably on the fiber tips. Carbon whisker arrays are then grown on the nickel coated fibers via PECVD processing.

The carbon fibers are precision cut from a continuous spool. Although the mean length of the pitch fibers will be controlled (typically 0.5 mm), there is some variation in length of 50 micron or more, which is comparable to the average distance between adjacent fibers. A few psi pressure is required to bend the longer fibers so that the tips of the shorter fibers contact the interfacing surface. In some embodiments, the velvet samples may be lapped and polished before deposition of the Ni film so that the fiber tips are more co-planar (within a few microns). This can be accomplished by EDM cutting or by potting the velvet in a removable medium and then lapping and polishing it flat. The potting medium is then removed.

Co-planar tips may allow the "whiskerized" velvets to have high conductivity using less than 1 psi pressure since there is no need to compress the velvet in order for all of the tips to contact the interfacing surface. Co-planar tips may also have an effect on the quality or uniformity of the whisker arrays on the tips.

In one specific process, six gaskets were potted in a removable polymer and lapped on both sides with fine sandpaper (600 grit). The potting medium was then removed. These gaskets were processed in a carbon CVD reactor in order to carbonize the epoxy wash coat and deposit a thin carbon CVD layer (~2 micron-thick) that would hold the fibers together. The resulting gaskets are then able to withstand the PE-HF CVD process. A 55±5 nm-thick film of Ni catalyst was ion-beam sputtered onto both sides of four of the carbon CVD'ed gaskets.

EXAMPLE

Pitch carbon fiber gasket sample cs7-144 was processed in the PE-HF CVD reactor under the conditions listed in Table 1

TABLE 1

PE-HF CVD deposition conditions of pitch fiber gasket sample

| Sample# | cs7-144 |
|---|---|
| Mounting conditions | Lying flat on anode |
| Plasma power | 160 W |
| HF power | 300 W |
| Max temperature | 527° C. |
| Plasma etch time | 12 min |
| Deposition time | 5 min |
| Hydrocarbon gas | Acetylene |
| Mass gain | 4.6 mg (5 %) |
| Resulting deposit | Heavy, bottom side |

After the chamber cooled, the sample was removed and examined under the microscope. The bottom of Sample cs7-144 was covered with carbon deposit that was visible under the optical microscope. The 90.5 mg sample had gained 4.6 mg, which corresponds to a 4 micron-thick, uniform layer of carbon over one surface. Some areas displayed thicker deposits than others did. The variation may reflect variation in local temperature, hydrocarbon concentration, and/or catalyst microstructure.

Figure 5:
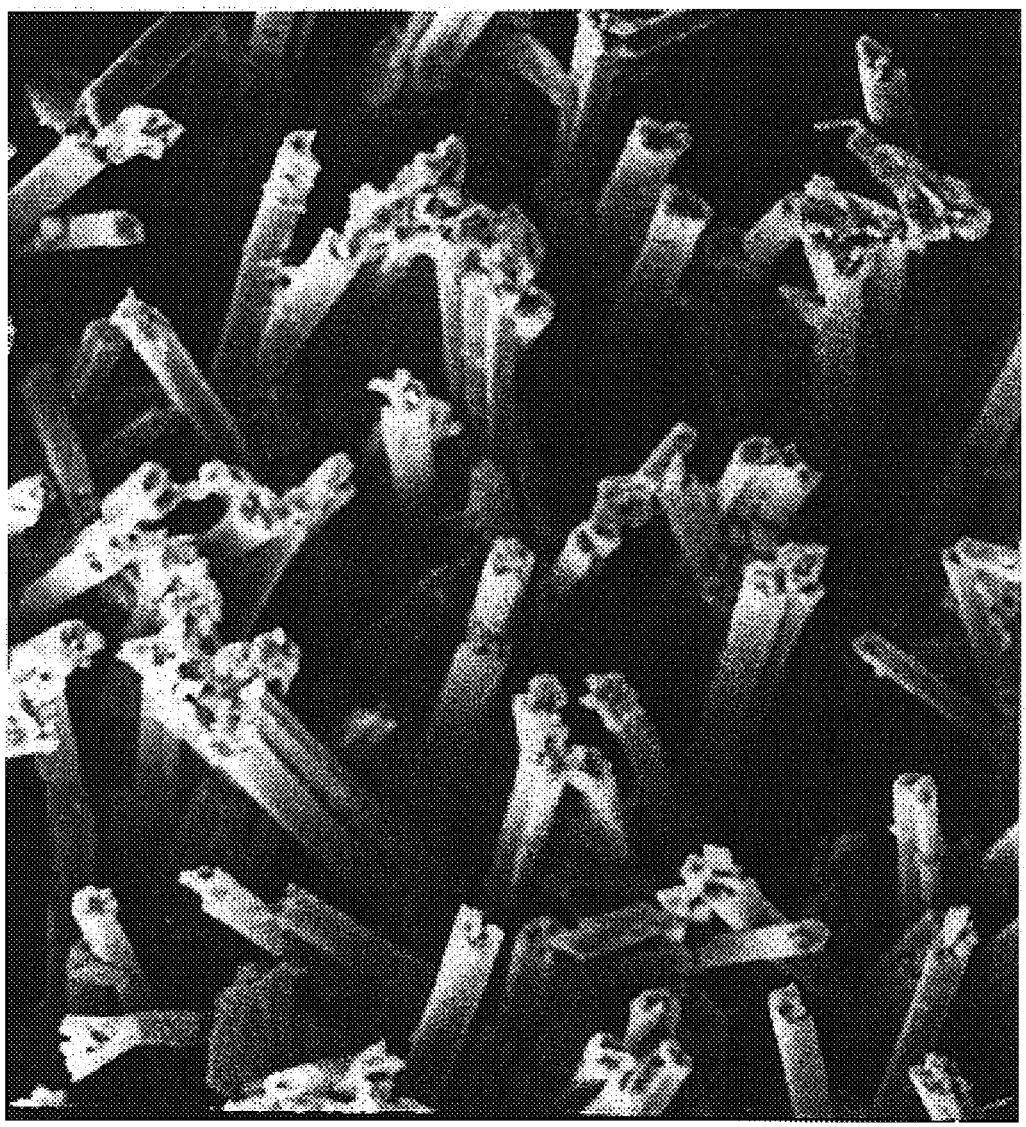
FIG. 5 is a scanning electron microscope image of the tips of the fibers of a thermal gasket prior to the deposition of nanofibrils.
Figure 6A:
FIG. 6A is a scanning electron microscope image the tip of one fiber of the gasket of FIG. 5 after lapping.
Figure 6B:
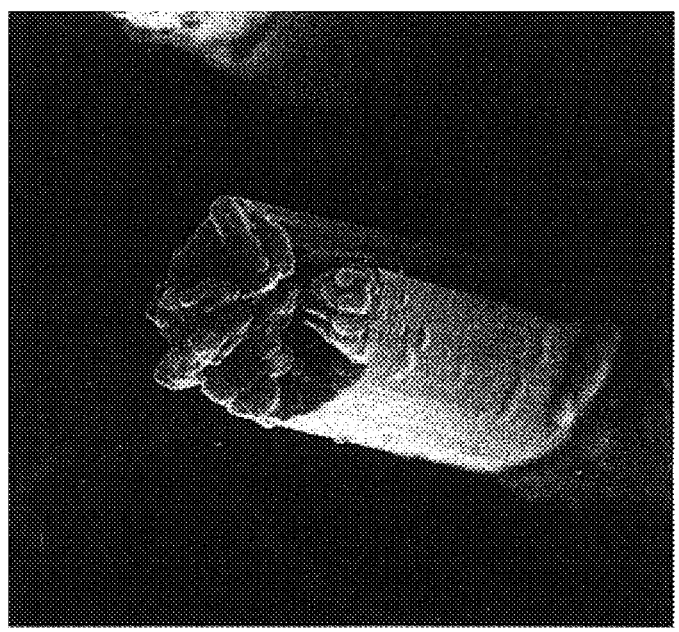
FIG. 6B is a scanning electron microscope image the tip of one fiber of the gasket of FIG. 5 after lapping and carbon CVD deposition.
Figure 6C:
FIG. 6C is a scanning electron microscope image the tip of one fiber of the gasket of FIG. 5 after lapping, carbon CVD deposition, and nanofibril deposition.
Figure 6D:
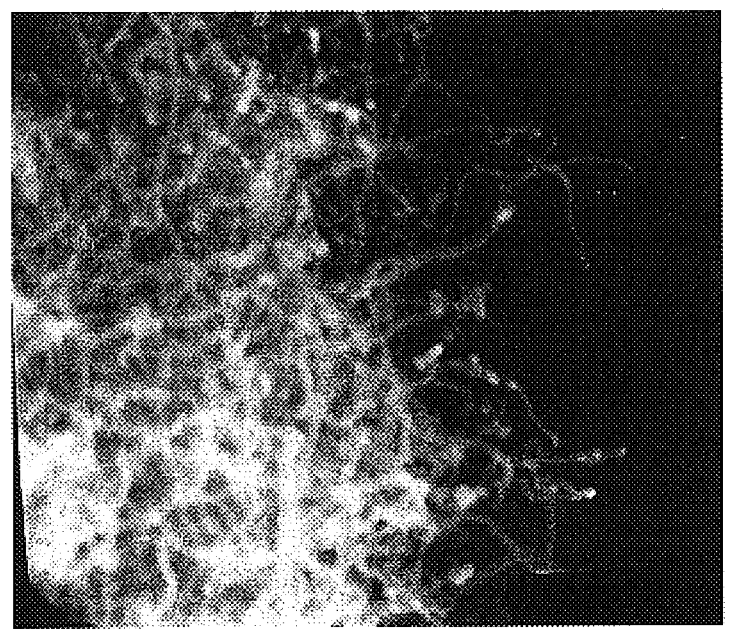
FIG. 6D is a higher magnification of the nanofibril mop of FIG. 6C.

FIG. 5 is a 250× SEM image of a pitch carbon fiber gasket, looking from above, prior to the deposit of nanofibrils to the larger diameter fibers. The preferential alignment of the fibers is evident. FIGS. 6A–6C show the tip of a single pitch fiber of Sample cs7-144 after various processing steps, FIG. 6A after lapping, FIG. 6B after carbon CVD, and FIG. 6C after PE-HF CVD. Many of the pitch fibers form a "pac-man"-shaped cross section during their manufacture. The fibers are remarkably flat after lapping. The carbon CVD deposited a uniform layer of ~2 μm of carbon, increasing the diameter of each fiber from ~12 μm to ~16 μm. It also formed a nodular structure at the tip which is no longer flat. In FIG. 6C, it is seen that the PE-HF CVD did indeed deposit an array of carbon nanofibrils on the tips and along the shafts of the fibers. FIG. 6D shows an ×10 k view of the nanofibrils. They are not straight, but form a "mop" which appears to be highly packed. The nanofibril diameters are on the order of 100 nm.

Another means of enhancing the conductance at the tips is to add phase change material (PCM) at and around the tips. Thermally-conductive PCM is commercially available from several vendors. It is typically sold in sheet form with thicknesses from 1 to several mils. It consists of a wax (high molecular weight hydrocarbon), filled with thermally conductive solid particles such as BN, alumina, diamond, silver flake, etc. As described above with reference to thermal grease, the phase change material may also include cut carbon nanofibrils. These particles typically have characteristic sizes from 1 to several microns. In addition, there may be wetting agents added so that the wax wets the particles, as well as the tips of the fibers.

Useful PCM is a solid at room temperature, and softens and melts at elevated temperatures. It may or may not be molten at operating temperatures. The PCM sheet is typically supported by release liner paper that is eventually peeled away before application. In some advantageous embodiments, the melting point of the material is between about 30 degrees C. and 100 degrees C. In some cases, the melting point is between about 40 degrees C. and 70 degree C.

The PCM can be added to the fiber tips by a number of methods. The fiber can be flocked into a sheet of PCM that is heated to just the right temperature so that the tips of the flocked fibers adhere to it and remain vertically oriented. The fibers can then be anchored to the PCM sheet by melting the PCM further and/or pushing the fiber tips further into the PCM. The resulting velvet may or may not then be partially encapsulated with silicone gel, PCM, acrylic spray, foam, or other means of encapsulation. The purpose of encapsulation is to (1) hold the fibers together, providing structural support, and (2) preventing fibers from escaping as potentially harmful debris. The latter is of special concern if the fibers are electrically conductive. Next, a PCM sheet can by placed on top of the resulting velvet, and the entire PCM/velvet/PCM sandwich pressed together and/or heated to fuse everything together.

This material has several advantages over the use of thermal grease and elastmoer potted velvets. Similar to grease, high thermal conductivity PCM improves interface conductance. However, the PCM may be localized preferentially near the tips. This makes gasket very compliant, unlike velvet that is totally filled with elastomer. Furthermore, solid PCM is not messy at room temperature like thermal grease, it supports velvet at room temperature when in solid form, and PCM acts as an adhesive that prevents fibers from escaping as debris.

Adhesive Material

The nanofibril material described above, which may advantageously include coupling nanofibrils to the larger fibers to form a fiber velvet, can also be used as an adhesive material. As explained above, fiber velvets can form compliant interface pads. These pads can be effective as a thermal interface since they make contact at their fiber tips. For uneven gaps, most or all of the fibers can bend independently in order to span the local gap. Low pressures are sufficient to allow substantially all of the fibers to touch both surfaces. These same attributes are also desirable in an adhesive. An adhesive material that incorporates a fiber velvet provides a dry and reusable medium for adhering to a mating surface.

FIG. 7A is a perspective view of a single-sided fiber velvet 50 that comprises an array of fibers. FIG. 7B is a detailed conceptual view of one of the fibers from FIG. 7A showing an array of nanofibrils 36 attached to the tip of a single fiber 38. The end of the fiber 38 that is distal to the nanofibrils 36 is fixedly attached to a base or substrate material 20 using one of the methods described above. The ends of the nanofibrils 36 that are distal to the fiber 38 are available for adhering to a mating surface.

Many configurations are possible depending on the application requirements. Thus, the fibers can be bonded to one or both surfaces of a central support with various adhesives or pressure sensitive adhesive (PSA) "tapes" including metal foils and polymers. A single-sided velvet 50 shown in FIG. 7A forms a flexible one-sided tape. Alternatively, a second array of fibers may be attached to a lower surface of the base 20 to form a two-sided tape. Previously described exemplary materials for the substrate or base 20 include a POCO graphite substrate a foil of aluminum, or a plastic film.

The fibers 38 can be, for example, any commercially available type. Commercially available carbon fiber include those formed from either pitch or PAN precursor material and drawn onto fiber tow. The carbon fibers 38 may be precision cut from a continuous spool.

The term "fiber" as used herein refers to a structure with greater than a 1:1 aspect ratio. The terms "nanofiber" or "nanofibril" as used herein refers to a fiber with a diameter of equal to or less than about 1 µm (micrometer).

Each fiber typically has a diameter of 6–10 µm, but which may vary between approximately 3 and 15 microns. In some embodiments, the fibers 38 of the carbon fiber velvet 50 have diameters that range from approximately 5 um to 10 um with lengths that range from approximately ½ mm to 3 mm. Electroflocking can be used to form the aligned fiber arrays 38 on the base 20. Pneumatic or mechanical flocking techniques may also be used.

Depending on the desired attachment scheme between the fiber velvet 50 and the mating surface, various geometric and material attributes of the fibers 38 can be selected. These attributes include material properties of the fibers and substrate, for example adhesive strength, modulus, Hamaker constant, dielectric constant, surface energy, and tensile strength and modulus and temperature regimes. These attributes also include geometry, for example, fiber length, fiber diameter, fiber number density, fiber angular bias, and pad thickness, For example, the diameters and lengths of the fibers 38 can be selected depending on the desired compliance of the adhesive material produced with them. To create a more compliant adhesive, fibers with a smaller diameter, longer length, or smaller modulus can be selected.

Once the material and diameter are selected, the fibers 38 can be precision cut to the desired length and assembled into the velvet using the techniques described above. For one embodiment in an adhesive application, 6-um diameter×1.5-mm long ex-polyacrylonitrile (ex-PAN) carbon fibers are selected for the carbon fibers 38. These ex-PAN fibers are a glassy carbon and have the advantages of a small diameter, are easy to bend, bend elastically, and do not break easily.

The fiber density of the fibers 38 also affects the properties of the adhesive material. Fiber density is the density of the fibers 38 in the fiber velvet 50. Fiber density is also referred to as a packing fraction. Thus, the packing fraction selected may also be based on the desired properties of the carbon fiber velvet 50. For example, a high (20%) packing fraction could be used if relatively low compliance but high adhesive strength was desired. However, for an adhesive application, the packing fraction can be selected as low as a few percent. A lower packing fraction increases the compliance of the resulting carbon fiber velvet 50.

To substantially improve the adhesive strength of the carbon fiber velvet 50 with a mating surface, arrays of carbon nanotubes/whiskers/nanofibrils 36 are deposited onto or grown from the tips of the carbon fibers 38. The deposited nanofibrils 36 can be arranged in a "mop" or in an aligned configuration on the tips of the carbon fibers 38. The aligned configuration has similarities to the contact ends of the setae of the gecko foot and is illustrated in FIGS. 7B and 7C. As with the fibers 38, the characteristics or attributes of the nanofibrils 36, for example, diameter, length, packing fraction, location, as well as their properties, for example, thermal and mechanical, can vary. Many of the characteristics of the nanofibrils 36 can be controlled by the growth process and tailored to match or surpass that of the split nanofibrils at the end of a Gecko's seta.

An exemplary process for growing nanofibrils 36 on a substrate will now be described. In this process, a thin film of nickel or cobalt catalyst was deposited onto the substrate by ion-beam sputtering. The substrate can be ion-beam cleaned prior to deposition. The resulting film thickness was monitored with a quartz crystal thickness monitor and varied from 1–13 nm thick. Thinner films promote growth of smaller diameter nanofibrils 36. An optional step in the process for growing nanofibrils 36 comprises the deposition of a buffer layer between the substrate and the thin film prior to catalyst deposition. The addition of the buffer layer may promote formation of Ni nanodots upon heating. The inclusion of a buffer layer may facilitate bonding of the nanofibrils 36 to the substrate. For example, a titanium (Ti) buffer layer can form a TiC "weld" between the nanofibrils 36 and the substrate.

The nanofibrils 36 were grown on the substrate in a PECVD reactor. The PECVD included a 1200° C. tube furnace with a 3"-diameter quartz tube. Cylindrical graphite electrodes were machined and assembled within the PECVD reactor. The substrate and deposited catalyst was placed on a lower electrode. The quartz tube was evacuated to less than 10 mtorr with a mechanical pump, and continued pumping as the temperature was raised to 700 or 750° C. Once the setpoint temperature was reached, an etchant gas ($NH_3$) was fed at a controlled rate (typically 200 sccm/min) with the pressure being adjusted to a few torr. High voltage (typically 600 V) was then applied between the electrodes and a plasma was initiated. Optionally, the $NH_3$ plasma is allowed to etch the substrate and deposited catalyst for several minutes before starting nanofibril 36 growth. The heating and/or etching step is critical in breaking up the catalyst film on the substrate to form nanodot seeds. Etching reduces the size of the nanodot seeds and breaks up larger nanodot seeds into smaller nanodot seeds. The size and density of the nanodot seeds determine the diameter and density of the nanofibrils that subsequently grow from the nanodot seeds. On silicon substrates, the diameter and density of the nanofibrils correlate with the Ni film thickness.

A controlled flow of feed gas, for example acetylene, is then fed to initiate nanofibril growth. Details of the Ni-substrate interaction determine whether and how the nanodots form. Depending on the adhesion between the Ni catalyst and the substrate, the nanofibrils 36 may grow in base-growth or tip-growth modes. Base-growth mode occurs when the catalyst seed remains attached to the substrate and the nanofibril grows out of the cataysl seed. Tip-growth mode occurs when the catalyst seed is carried with the tip of the nanofibril as the nanofibril grows from the catalyst seed). Adhesion of the Ni catalyst to the substrate promotes base growth. After about 15 minutes, the plasma was turned off and the gas flow stopped. The substrate and grown nanofibrils were allowed to cool in vacuum.

Other methods for growing well-aligned nanofibrils on a substrate are described in U.S. Pat. No. 6,361,861 to Gao et al., which is hereby incorporated by reference in its entirety and by Li et al., Appl. Phys. Lett. 75, 367 (1999).

The attributes of an exemplary fiber velvet 50 that comprises arrays of nanofibrils 36 attached to carbon fibers 38 are described below. A combined packing fraction for the velvet 50 is calculated by multiplying the packing fraction of the carbon fibers 38 with the packing fraction of the nanofibrils 36. The combined packing fraction for the exemplary velvet 50 described below is 2% (10% carbon fiber× 20% nanofibrils).

| Carbon Nanotube (CNT) array on a carbon fiber tip | |
|---|---|
| Carbon fiber 38 | |
| Diameter, D | 5 μm |
| Length, L | 500–1000 μm |
| Aspect ratio, α = L/D | 100–200 |
| Packing fraction, φ | 10% |
| Young's modulus, E | 234 GPa |
| Pad Compliance (Eφ/α²) | ~$10^6$ Pa |
| Multi-Walled Nanotube (MWNT) array 36 | |
| Diameter, D | 20–200 nm |
| Length, L | 10–50 μm |
| Aspect ratio, α = L/D | 1000 |
| Packing fraction, φ | 20% |
| Young's modulus, E | 1000 GPa (est) |
| Pad Compliance (Eφ/α²) | ~$10^5$ Pa |

As explained with reference to FIGS. 6A–6C, the carbon fibers 38 can be lapped and polished to form a carbon fiber velvet 50 with a uniform length and flat tips. Lapping and polishing before attaching or growing nanofibrils 36 results in the fiber tips being more co-planar (within a few microns). This geometry provides a flat surface from where to grow the nanofibrils or nanotubes 36. Such controlled tip geometry enhances the consistency of the adhesive surface of the nanotubes or nanofibrils 36 that grow on the flat tips of the carbon fibers 38. One method of lapping the fiber tips involves potting the fibers 38 during lapping of the carbon fiber tips. After lapping, the potting media is removed from between the carbon fibers 38. An example of such a removable potting medium is mothballs. However, lapping and polishing of the carbon fiber tips is not required for the subsequent attachment of the nanofibrils 36 thereon. Alternatively, electro-discharge machining (EDM) can be used to flatten the ends of the carbon fibers 38 prior to attachment of the nanofibrils 36.

Figure 8:
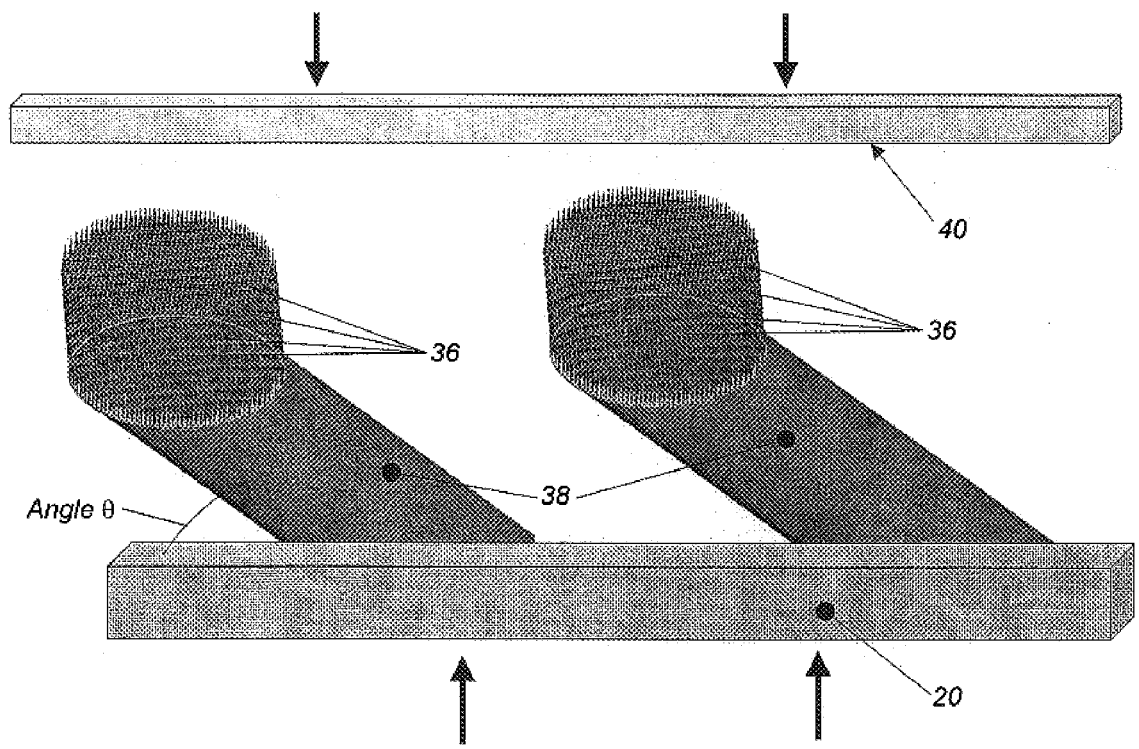
FIG. 8 is a perspective view of two biased carbon fibers having nanofibrils grown at an acute angle to the carbon fiber shafts.

FIG. 8 illustrates a single fiber 38 that is at a bias angle θ with respect to the base material 20. A biased velvet has fibers 38 which are not perpendicular to the underlying base 20. Embodiments of the velvet include fibers 38 that are biased in the same direction with respect to the base 20. Angles between 0 and 90 degrees could be selected. Biasing the carbon fibers 38 can further increase the compliance of the carbon fiber velvet 50. In one embodiment of the carbon fiber velvet 50, an angle of about 45 degrees is formed between the underlying base 20 and the carbon fibers 38.

By biasing the carbon fibers 38 at a particular angle and then lapping the tips of the carbon fibers 38, the nanofibrils 36 can be grown or attached at a particular angle to the carbon fiber 38 shafts as shown in FIG. 8. For example, as illustrated in FIG. 8, the nanofibrils can be grown or attached at an angle that is complementary to the angle θ so that the nanofibrils 36 are normal to the base 20 and/or a mating surface 40. Alternatively, the nanofibrils 36 are grown or attached at an angle with respect to the carbon fiber shafts so that the nanofibrils 36 are not perpendicular or normal to the base 20 and /or the mating surface 40. These angled nanofibrils 36 with respect to the carbon fiber shafts may be more compliant than the carbon fibers 38 when contacting the mating surface 40.

Any of the deposition techniques previously described, including CVD, PECVD, or using an AO template, can be used to grow carbon nanofibrils 36 on the tips of carbon fibers 38. These deposition techniques utilize a nano-sized metal catalyst (e.g. nickel, iron, or cobalt) particle on the carbon fiber 38 tip from which the carbon nanotube grows. The catalyst might remain to provide a strong bond to the carbon fiber 38 tip. The strength of the base attachment can be improved by, for example, heat treatment. Another means by which the nanofibril can remain strongly attached to the fiber tip is by reacting the carbon nanofibril with a layer of Ti or other metal to form TiC or other appropriate carbide as a weld. Still another method of strongly attaching the carbon nanofibrils to the carbon fiber tip is by encapsulating with a conformal coating of carbon by chemical vapor deposition (CVD).

One method of depositing the catalyst particles on the ends of the carbon fibers 38, is by ion beam sputtering a thin film of catalyst metal onto the carbon fiber 38 tips, and then appropriate heat treatment and/or etching in order to create nanometer-sized catalyst particles. The nanofibril 36 arrays then grow on the catalyst coated fibers 38 via PECVD processing. In embodiments where the nanofibrils 36 are grown at ~650 degrees C., a carbonizable adhesive can be used to attach the carbon fibers 38 to a carbon (e.g. POCO graphite) substrate. Such a configuration for the carbon fibers 38 and nanofibrils 36 results in comparable size, length, and packing fraction values to that of Tokay gecko setae.

The nanotubes 36 can be coated for specific environments. For example, coating the nanotubes with SiC enhances their high temperature capability in an oxidizing atmosphere (such as air).

The diameter of the nanofibrils 36 affects the adhesive strength between the tips of the nanofibrils 36 and the mating surface 40. It is postulated that once intimate contact between the nanofibrils 36 of the adhesive material and the mating surface 40 occurs, the compliance of the nanofibrils 36 allows the adhesive material to stick to the mating surface 40 by intermolecular (van der Waals) forces. The van der Waals (vdW) force occurs between the uncharged atoms of the mating surface 40 and the uncharged atoms of the nanofibrils 36. These vdW forces occur due to the mutual induction of an electric dipole moment in each atom. These mutually-induced electrical dipoles attract the nanofibril 36 to the mating surface 40 and vice versa. To maximize the vdW adhesion, it is desirable that the nanotubes 36 be relatively straight or slightly curved, have high packing fraction, small, uniform diameters, and long, uniform lengths.

The dipole-dipole pair potential for the vdW forces is given by $V=-C/r^6$, where C is a constant roughly proportional to the polarizabilities of the atoms. The vdW force between macroscopic bodies is the sum of all forces between atoms of one body and those of the other. While the vdW force is usually thought to be small between two atoms, it can be quite large between macroscopic bodies, especially when in close contact.

The vdW force between a sphere of radius R and a flat surface, separated by distance D is:

$$F = \frac{AR}{6D^2};$$

where A is the Hamaker constant defined as $A=\pi C \rho_1 \rho_2$, $\rho_1$ and $\rho_2$ are the number of atoms per volume in the two bodies, and C is the coefficient in the atom-atom pair potential $V=-C/r^6$. Because C is roughly proportional to the polarizabilities of the two materials, A is approximately constant (i.e. independent of density) for all materials, lying in the range $0.3–6\times10^{-19}$ J for solid bodies. For further discussion see Israelachvili, J. N., *Intermolecular and Surface Forces*, published by Academic Press, San Diego, 1985 which is hereby incorporated by reference in its entirety.

The adhesive pressure over the projected area of the sphere is therefore:

$$P = \frac{F}{\pi R^2} = \frac{A}{6\pi D^2 R}.$$

For an array of spheres with packing fraction ϕ, the adhesive force per area becomes:

$$P = \frac{A\phi}{6\pi D^2 R}.$$

Taking $A=10^{-19}$ J, D=0.3 nm, and ϕ=6%, the calculated adhesive strength for spheres, or fibers with hemispherical tips, as a function of sphere/fiber radius are listed below.

| Fiber radius, R | Force per fiber, F (N) | P (psi) |
| --- | --- | --- |
| 2 micron | 3.70E−07 | 0.26 |
| 200 nm | 3.70E−08 | 2.6 |
| 20 nm | 3.70E−09 | 26 |
| 2 nm | 3.70E−10 | 260 |

This model shows that more smaller fibers adhere more strongly than fewer large fibers of equal area because more atoms are in closer contact with the flat mating surface 40. Furthermore, as the fiber radius reaches the nanometer range as with nanofibrils 36, the adhesive strength can reach hundreds of psi.

The density or packing fraction of the nanofibrils 36 affects the adhesive strength between the tips of the nanofibrils 36 and the mating surface 40. While the gecko foot has of the order $10^6$ nanofibrils per mm$^2$, the nanotube arrays 36 have typical densities of $10^7–10^8$/mm$^2$ as described in Ren et al. and Li et al. For a carbon fiber 38 packing fraction of 10%, this would give a nanofibril 36 density of $10^6–10^7$, which is comparable to or higher than the density for the gecko foot.

The aspect ratio of the nanofibrils 36 can be selected such that they will be able to bend and conform to any contacting mating surface 40. In one embodiment, a nanotube array 36 with 50 nm diameter×5 um length would include such attributes.

Depositing additional material on the contact surface of the nanofibrils 36 can further enhance their adhesive strength to the mating surface 40. For example, if the nanofibrils 36 are open at the ends and have insufficient tip area for high adhesive strength, the nanofibril 36 tips can be encapsulated or filled. This filling can be accomplished by, for example, depositing a thin film with a thickness that is comparable to the nanofibril 36 diameter. The encapsulating material could be, for example, a metal or a compliant polymer such as parylene. The encapsulating material can comprise, for example, conductive particles. The electrical characteristics of these conductive particles can be varied depending on the attributes desired of the adhesive material.

For line of sight deposition on the tips of the nanofibrils 36 by sputtering or evaporation, the deposited thin film can be thickest at the tips and thinned out on the upper surface area shafts of the nanofibrils 36. Such an enhanced tip of the nanofibril 36 serves a similar purpose as a gecko spatula to the setae. If a non-planar or rounded geometry is attained for the tip of the nanofibril 36, such a rounded tip may adhere well in various orientations.

Depending on the microstructure of the carbon fiber velvet 50, the microstructure may be susceptible to clogging by dirt or other particles. The attributes of the microfibrils 36 can be further selected to enhance self-cleaning whereby the contaminants are expelled from the microstructure. For example, it may be important for the material to be hydrophobic to enable this self-cleaning feature, and or comprise a certain packing fraction of nanofibrils. These features are used by the lotus plant to keep it clean. In this way, the attributes of the fibers can be optimized to reduce the effect of contaminants on the adhesive properties of the material.

One of the advantages of this nanostructure is that the adhesive material is compliant and therefore able to conform to both flat and nonflat or rough surfaces with a minimal amount of applied pressure. Another advantage is that the adhesive material makes dry contact, sticking by intermolecular (van der Waals) forces, without leaving a sticky residue. Other advantages include: controlled design and manufacture, enabling tailoring and optimizing of array features by modifying fiber and nanotube diameters, lengths, packing fractions, orientation, and location.

Exemplary applications of the adhesive material described herein include a wide range of ambient, and even hostile conditions: submarine, high temperature, space vacuum, and chemically corrosive environments. In some advantageous embodiments of the invention, the thermal conductivity and/or electrical conductivity of the carbon fibers can be combined with the adhesive properties. This can produce an electrical or thermal gasket/interface material that sticks without glue or mechanical fasteners to the components it is in contact with.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. An adhesive material for attaching to a mating surface, comprising:
   a base;
   an array of electroflocked first fibers bonded to the base, each having a cross sectional diameter of less than approximately 15 microns; and
   an array of second fibers bonded predominantly to a distal portion of at least some of said first fibers and having a cross sectional diameters of less than about 1 micron, said second fibers being arranged and configured to form an intermolecular (e.g. van der Waals) bond when pressed against the mating surface.

2. The adhesive material of claim 1, wherein the first fibers have a diameter of approximately 5 to 10 microns.

3. The adhesive material of claim 1, wherein the second fibers have a diameter of approximately 0.005 to 0.5 microns.

4. The adhesive material of claim 1, wherein the second fibers are substantially parallel to the first fibers.

5. The adhesive material of claim 1, wherein the first fiber extends in a normal direction from the base.

6. The adhesive material of claim 1, wherein the first fiber extends in a direction to form an oblique angle with the base.

7. The adhesive material of claim 6, wherein the second fibers are substantially skew to the first fiber.

8. The adhesive material of claim 7, wherein the second fibers are substantially parallel to a normal direction extending from the base.

9. The adhesive material of claim 1, wherein the second fibers comprise carbon nanotubes.

10. The adhesive material of claim 1, wherein the first fiber extends from at least one side of the base.

11. The adhesive material of claim 10, wherein the first fiber extends from both sides of the base.

12. The adhesive material of claim 1, further comprising a coating material located on tips of the second fibers and in contact with the first surface.

13. The adhesive material of claim 12, wherein the coating material is a metal.

14. The adhesive material of claim 12, wherein the coating material is a polymer.

15. The adhesive material of claim 1, wherein the portion is the fiber tip area.

16. The adhesive material of claim 1, wherein the first fiber and the second fibers both comprise carbon.

17. The adhesive material of claim 1, wherein an adhesive force between the adhesive material and the mating surface is approximately equal to or greater than 0.26 psi.

18. The adhesive material of claim 1, wherein an adhesive force between the adhesive material and the mating surface is approximately equal to or greater than 2.6 psi.

19. The adhesive material of claim 1, wherein an adhesive force between the adhesive material and the mating surface is approximately equal to or greater than 26 psi.

20. The adhesive material of claim 1, wherein an adhesive force between the adhesive material and the mating surface is approximately equal to or greater than 260 psi.

21. A fabricated microstructure, comprising:
    a base;
    a shaft with a length of about 500 microns and being connected to the base, said shaft having a diameter of between about 3 and 15 microns; and
    an array of whiskers having terminal ends formed at an end of said shaft distal from said base, said array of whiskers having a width of less than about 10 microns.

* * * * *